United States Patent
Pickering et al.

(10) Patent No.: US 7,260,454 B2
(45) Date of Patent: Aug. 21, 2007

(54) VEHICLE EQUIPPED WITH A CONTROL SYSTEM FOR OPERATING ONE OR MORE VEHICLE SUB-SYSTEM

(75) Inventors: Carl Pickering, Kenilworth (GB); Peter Thomas, Cotesbach (GB)

(73) Assignee: Jaguar Cars Limited, Coventry (GB)

( * ) Notice: Subject to any disclaimer, the term of this patent is extended or adjusted under 35 U.S.C. 154(b) by 270 days.

(21) Appl. No.: 10/976,046

(22) Filed: Oct. 28, 2004

(65) Prior Publication Data

US 2005/0090946 A1    Apr. 28, 2005

(30) Foreign Application Priority Data

Oct. 28, 2003 (GB) ................. 0325075.0
Sep. 30, 2004 (GB) ................. 0421695.8

(51) Int. Cl.
*G06F 17/00* (2006.01)
(52) U.S. Cl. ............................... 701/2; 701/36
(58) Field of Classification Search ......... 701/1–2, 701/36; 345/169–170, 173; 200/308, 310; 340/426.13, 426.16, 426.17
See application file for complete search history.

(56) References Cited

U.S. PATENT DOCUMENTS

| 4,495,651 A | 1/1985 | Froeliger |
| 4,812,831 A | 3/1989 | Laier |
| 6,028,537 A * | 2/2000 | Suman et al. ............... 340/986 |
| 6,498,600 B1 | 12/2002 | Vance |

\* cited by examiner

*Primary Examiner*—Y. Beaulieu
(74) *Attorney, Agent, or Firm*—Gary A. Smith; Brooks Kushman P.C.

(57) ABSTRACT

A vehicle is equipped with a transmitter/receiver user recognition device and a control system for allowing a user to act remotely on one or more sub-systems of a vehicle, e.g., opening a panel such as a boot. In use, the system operates in association with a user identification device so as to activate an illumination block when the identification device has been recognized by the user recognition device and the identified user's hand is approaching, and to control the operation of one of the sub-systems when the identified user s hand is touching the illumination legend.

7 Claims, 2 Drawing Sheets

VEHICLE EQUIPPED WITH A CONTROL SYSTEM FOR OPERATING ONE OR MORE VEHICLE SUB-SYSTEM

CROSS-REFERENCE TO RELATED APPLICATIONS

This application claims foreign priority benefits under 35 U.S.C. § 119(a)-(d) to GB 0325075.0 filed Oct. 28, 2003 and GB 0421695.8 filed Sep. 30, 2004, which are hereby incorporated by reference in their entirety.

FIELD OF THE INVENTION

The present invention relates to a motor vehicle comprising a control system for operating one or more vehicle sub-systems. In particular a control system which allows a user to act remotely on a vehicle, from outside this vehicle.

TECHNICAL BACKGROUND

It is known to provide vehicles with "hand free" access system allowing user to act on a vehicle, e.g. for locking/unlocking the locks of the openable-panels of the vehicle, from outside this vehicle, if the user carries an appropriate identifier which is recognized by a transmitter/receiver recognition device with which the vehicle is equipped, when it lies in a specified geographical zone in the vicinity of the vehicle.

One disadvantage of such system is that generally the user needs to walk around his vehicle to operate the desired openable-panels.

SUMMARY OF THE INVENTION

According to a first aspect of the invention there is provided a motor vehicle being equipped with a transmitter/receiver user recognition device, and with a control system for allowing a user to act remotely on one or more sub-systems of a vehicle wherein the control system comprises a central processing unit arranged to control operation of the sub-systems, and a control panel located on an exterior part of the vehicle and connected to the central processing unit, the control panel comprising a display panel which includes a printed film incorporating an illumination legend for each sub-system, an illumination block and sensing means positioned between the printed film and the illumination block, whereby in use the control system operates in association with a remote user identification means so as to activate the illumination block when the remote user identification means have been recognized by the recognition device and the identified user's hand is approaching, and control the operation of one of the sub-systems when the identified user's hand is touching the illumination legend.

Preferably, the control panel is arranged on a vehicle door mirror.

Also preferably the sensing means comprises a transmitting means which is arranged between the display and the illumination block such that the central processing unit can use the measure of the current pulled from the transmitting means into a part of the body of a user to activate the illumination of the control panel or the operation of the corresponding sub-system.

Preferably, the sensing means comprises an outer electrode and an inner electrode each of which is disposed on a carrier surface substrate and connected together by a clear conductive ink, and wherein a layer acting as an earth shield is disposed on the underside of the carrier substrate, the inner electrode and the layer both defining an area through which light from the illumination block can pass.

The printed film of the control panel may be bonded to the top surface of the carrier substrate and the illumination block is bonded to the bottom of the carrier substrate.

The illumination block may include two sets of lights, a first set of lights for illuminating the border created between the inner electrode and the outer electrode, and a second set of lights for illuminating the area created inside the inner electrode and arranged so that each set of lights is associated with a light guide. In this case the light guide comprises preferably a first light guide and a second light guide in which one of them is placed into the other.

BRIEF DESCRIPTION OF THE DRAWINGS

The invention will now be described by way of example with reference to the accompanying drawings of which.

DETAILED DESCRIPTION OF THE PREFERRED EMBODIMENTS

Figure 1:
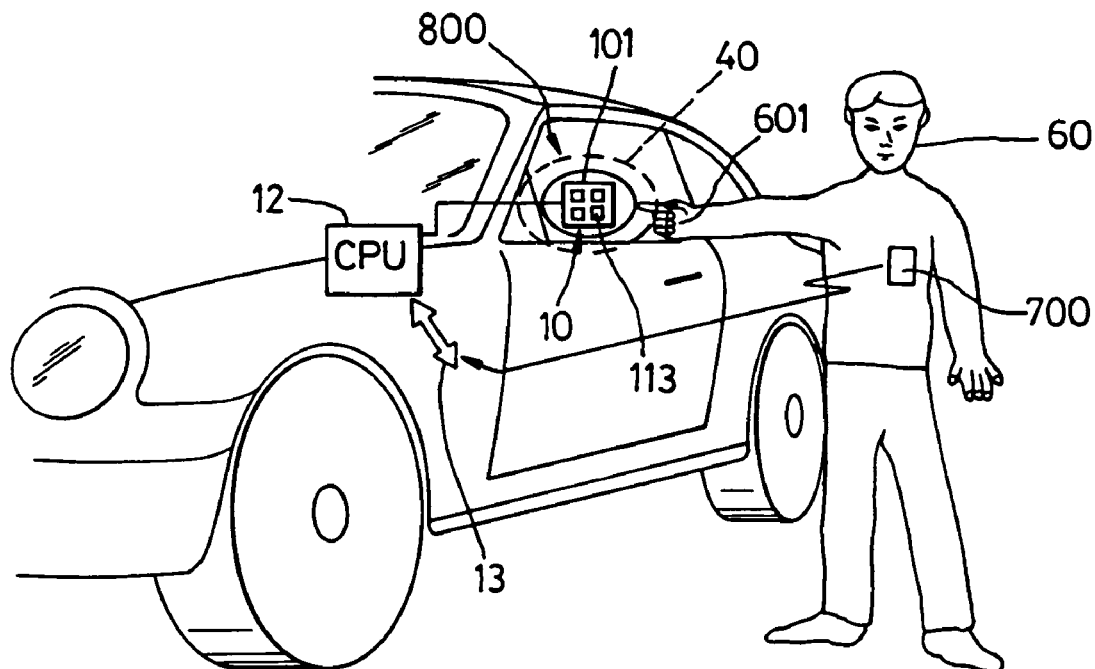
FIG. 1 is a schematic side view of a motor vehicle incorporating a control system according to an embodiment of the invention.
Figure 2:
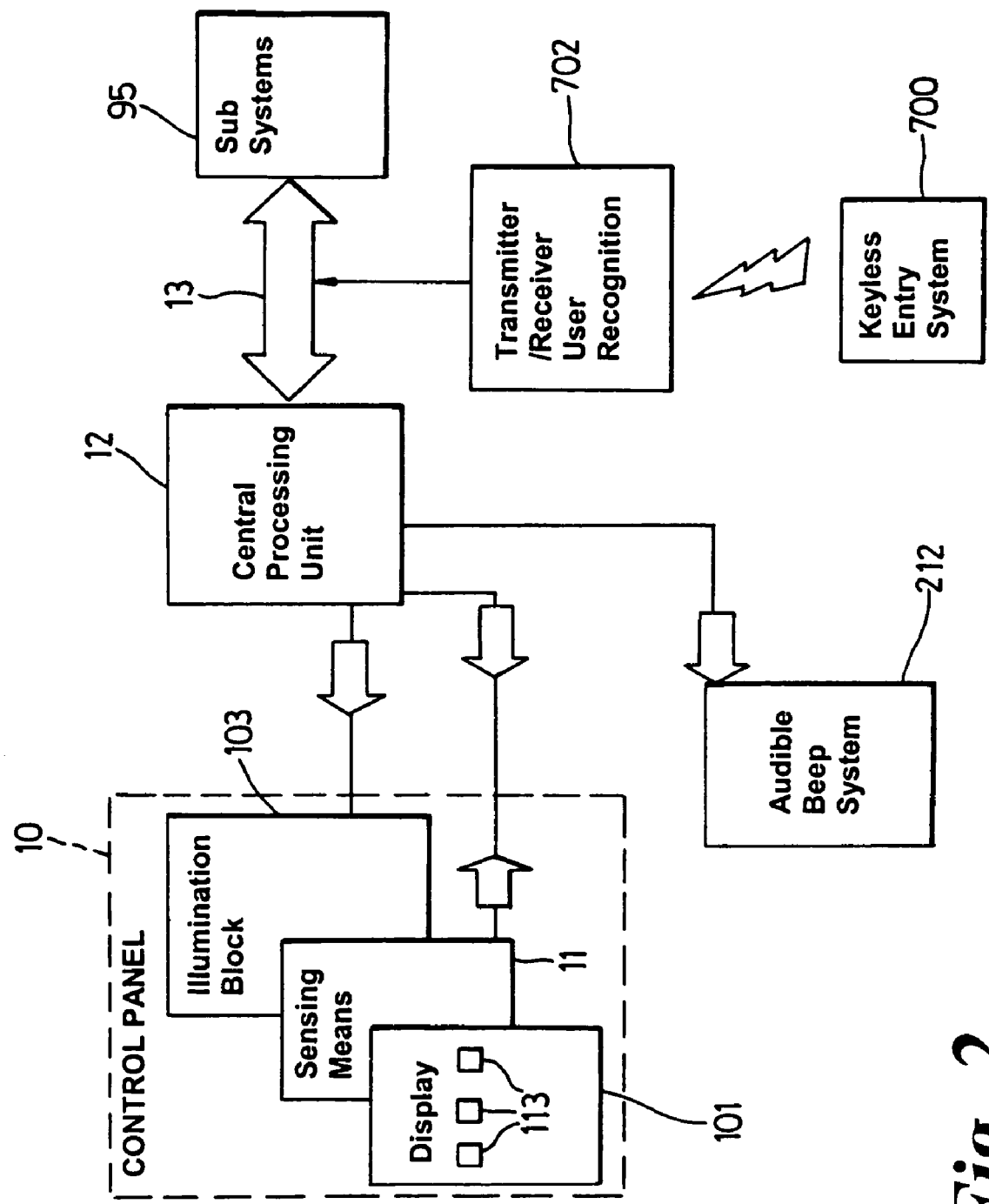
FIG. 2 is a schematic system diagram of the control system according to an embodiment of the invention.

Referring to the drawings, in particular FIGS. 1 and 2, there is shown a motor vehicle having front doors on each side. As is conventional, each front door comprises a door mirror which is installed on the outside surface of the motor vehicle's door. The driver's door mirror comprises a housing or casing 800 which is provided on its external surface with a control panel 10 so as to operate from the outside of the vehicle one or more vehicle functions 95 such as opening a panel, e.g. a bonnet, a boot, a fuel filler cap, a hood down/up, or a defrost system or ventilation system.

The control panel 10 includes a plurality of user input elements in the form of capacitive touch switches 113 which are connected to a central processing unit (CPU) 12. The CPU 12 controls the operation of one or more vehicle sub-systems 95 commanded from the control panel 10. An audible beep system 212 is also coupled to the CPU 12.

The control panel 10 includes sensing means 11 which can detect when an operator's hand is approaching or touching one of the capacitive switches 113 and in response the CPU provides information to the operator as an audible signal via the audible beep system 212. When the operator's hand is approaching near the control panel 10, a response is also provided by an illumination of the control panel 10 as will be described in greater detail hereinafter.

The CPU 12 is connected to a bus interface 13 so that it can send instructions to the sub-system 15 and also use data available on the vehicle CAN bus.

Figure 3A:
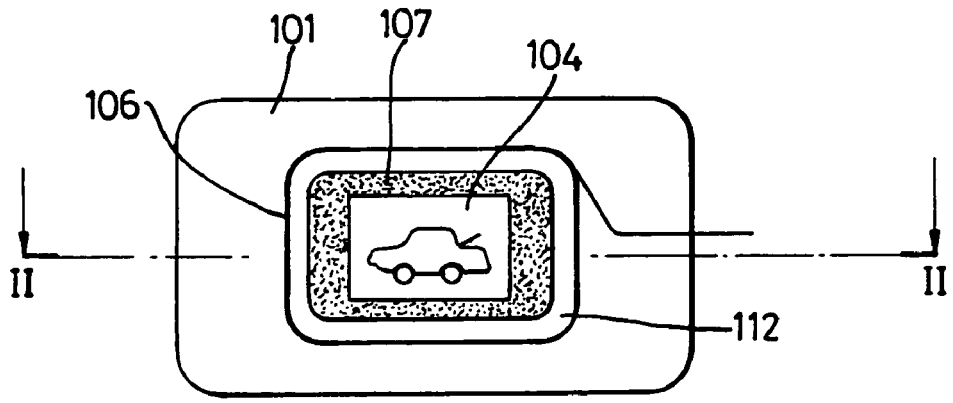
FIG. 3A is a plan view to part of control panel shown in FIG. 2.
Figure 3B:
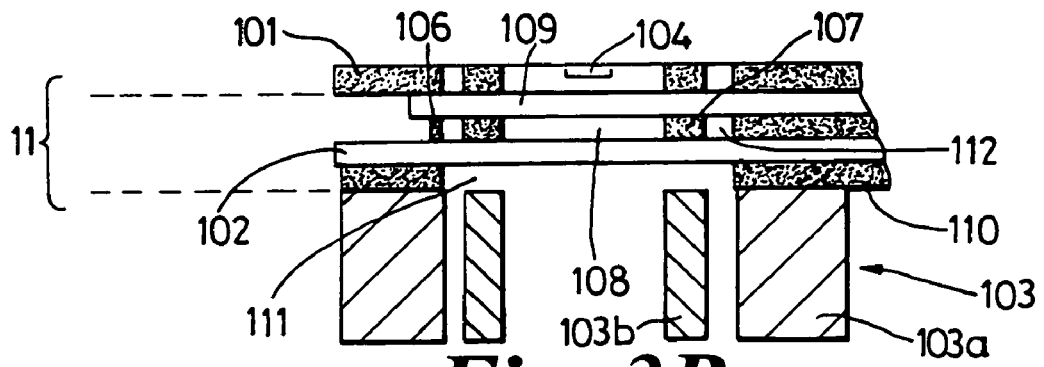
FIG. 3B is a cross-sectional view of FIG. 3A along a line II-II.

Referring to the FIGS. 3A and 3B, the control panel 10 further includes a front display panel 101 which may have a plain black finish or another colour similar to the colour of the vehicle's mirror casing for example, behind which is successively arranged a carrier substrate 102 bearing touch switches and an illumination block 103. It will be appreciated that the display 101 incorporates a waterproof membrane to protect the panel from water, dust and dirt.

The carrier substrate 102 comprises for each touch switch an electrode arranged so that the light emitted by the illumination block 103 can pass through the carrier substrate 102 and reach a printed film 101 incorporating an illumination legend 104 for each sub-system.

There will be described below a preferred method of attaching touch switches to a carrier surface substrate to form a touch switch assembly and in particular a capacitive touch switch not having an integrated control circuit.

The carrier substrate 102 is composed of a clear plastic sheet on which is disposed for each touch switch an outer electrode 106 and an inner electrode 107. The inner electrode 107 encloses an area 108. It will be noted that the electrodes 106, 107 can have various shapes and sizes according to the shape of the illumination legend 104.

A clear conductive ink 109 is then painted over both the inner electrode 107 and the outer electrode 106 so that the electrodes are electrically connected to each other. By being clear it allows light to pass through.

A conductive layer 110 is painted onto the underside of the carrier substrate 102 to act as an earth shield. A gap 111 is left in this layer 110 for a border 112 and illuminated legend 104 of each touch switch 113.

The printed film 101 of the control panel 10 is then bonded to the top surface of the carrier substrate 102 and the illumination block 103 is bonded to the bottom of the carrier substrate 102.

This illumination block 103 includes two sets of lights (not shown), for example (Light emitting diode) LED's, a first set of lights being arranged to illuminate the border 112 of each touch switch created between the inner electrode 107 and the outer electrode 106 and a second set of lights being arranged to illuminate the area 108 created inside the inner electrode 107 which in this particular embodiment contains a pictogram corresponding to a vehicle sub-system, e.g. opening the boot. The arrangement of such a set of lights provides user feedback.

Further the illumination block 103 comprises a first light guide 103a and a second light guide 103b. The first light guide 103a is constituted by a moulded plastics light guide. The second light guide 103b is also constituted by a moulded cylindrical plastics light guide aligned with each pictogram to prevent the spread of light from the rectangular border to the pictogram and to allow each to be individually illuminated.

It will be noted that the both electrodes 106, 107 and the layer 110 are connected to a connector (not shown) for connection to the CPU which behaves as a control circuit.

The control panel 10 is also interfaced with an identified user 700 by means of a keyless entry system so as to ensure that only the driver 60 is able to operate the external control panel 10 for security reasons. Inputs of the keyless entry system are intended to be recognized by a transmitter/receiver user recognition device 702 with which the vehicle is equipped. The information of user's identification is available on the interface bus 13 which is connected to the CPU.

While the user with his keyless entry system 700 is not operating the control panel 10, provided no part of his body is within a predetermined region close to the control panel 10, then no signal will be detected from the touch switches. Under these conditions the display 101 of the control panel is not operated and the switches are not visible.

When the driver's hand 601 is detected in the region 40 and the keyless entry system 700 has been recognized by the recognition device, then the current is pulled from the electrodes into the body and will be measured by the CPU. The CPU activates the illumination of the control panel 10 which permits the user to see each of the hidden switches which allow to activate a function of the vehicle, e.g. opening the boot, opening/closing the hood, the windows or activated the defrost system. When the finger is pointed at each switch pad 113 the nearest pad is highlighted by the border being illuminated, this will effectively help in guiding the user's hand to the switch pad he requires. The current measured permits the CPU 12 to operate the correct illumination of the switch pads so that the highlighted border will follow the movement of the finger. Alternatively, the illumination intensity can be increased as the finger gets closer to the selected switch pad. When the user's hand touches one of the pads on the control panel 10, this contact is detected and the CPU operates the subsystem. The CPU actives an audible signal and the relevant switch pad 113 is illuminated. This will provide feedback to the user since there is no tactile feedback. This sequence of operation continues each time a hand approaches and each time a switch pad is touched. In a further alternative, when the hand is in the region, the illumination block only illuminates the first set of lights in order to illuminate the illumination legend and then, as the finger gets closer to selected switch pad, the border is illuminated by the second set of lights.

When the operation is complete and the hand moves away from the control panel 10, the CPU activates an internal timer. For instance when 10 seconds have elapsed then the switch illumination will fade out making the switches invisible again.

It will be appreciated that the panel control will fade out after a specified time The display panel 101 would then return to a black finish to suit the exterior trim of the vehicle door mirror.

It will be appreciated that the preferred embodiments implement electric field touch switches. The principles of the present invention can be seen by those skilled in the art as appropriate for any manner of touch switch device.

Although the control system as described herein is located on the vehicle door mirror it will be appreciated that this need not be the case and it could be arranged on an external panel of the vehicle.

We claim:

1. A motor vehicle being equipped with a transmitter/receiver user recognition device and with a control system for allowing a user to act remotely on one or more sub-systems of a vehicle wherein the control system comprises a central processing unit arranged to control operation of the sub-systems, and a control panel located on an exterior part of the vehicle and connected to the central processing unit, the control panel comprising a display panel which includes a printed film incorporating an illumination legend for each sub-system, an illumination block and sensing means positioned between the printed film and the illumination block, whereby in use the control system operates in association with a remote user identification means so as to activate the illumination block when the remote user identification means have been recognized by the recognition device and the identified user's hand is approaching, and control the operation of one of the sub-systems when the identified user's hand is touching the illumination legend.

2. A vehicle as claimed in claim 1 wherein the control panel is arranged on a vehicle door mirror.

3. A vehicle as claimed in claim 1 or claim 2 wherein the sensing means comprises a transmitting means which is arranged between the display and the illumination block such that the central processing unit can use the measure of the current pulled from the transmitting means into a part of the body of a user to activate the illumination of the control panel or the operation of the corresponding sub-system.

4. A vehicle as claimed claim 3 wherein the sensing means comprises an outer electrode and an inner electrode each of which is disposed on a carrier surface substrate and connected together by a clear conductive ink, and wherein a layer acting as an earth shield is disposed on the underside of the carrier substrate, the inner electrode and the layer both defining an area through which light from the illumination block can pass.

5. A vehicle as claimed in claim 4 wherein the printed film of the control panel is bonded to the top surface of the carrier substrate and the illumination block is bonded to the bottom of the carrier substrate.

6. A vehicle as claimed in claim 5 wherein the illumination block includes two sets of lights, a first set of lights for illuminating the border created between the inner electrode and the outer electrode, and a second set of lights for illuminating the area created inside the inner electrode and arranged so that each set of lights is associated with a light guide.

7. A vehicle as claimed in claim 6 wherein the light guide comprises a first light guide and a second light guide in which one of them is placed into the other.

* * * * *